United States Patent [19]

Min et al.

[11] Patent Number: 4,473,802

[45] Date of Patent: Sep. 25, 1984

[54] ELECTRICAL SIGNAL CONVERTER WITH STEP VARIABLE GAIN

[76] Inventors: Mart V. Min, ulitsa Ladva, 26; Toomas E. Parve, bulvar Ryannaku, 3; Toom A. Pungas, Syprue pst., 219, kv. 3, all of Tallin, U.S.S.R.

[21] Appl. No.: 364,842

[22] PCT Filed: Jul. 31, 1980

[86] PCT No.: PCT/SU80/00134
§ 371 Date: Mar. 18, 1982
§ 102(e) Date: Mar. 18, 1982

[87] PCT Pub. No.: WO82/00536
PCT Pub. Date: Feb. 18, 1982

[51] Int. Cl.³ .......................... H03F 1/34; H03G 3/18
[52] U.S. Cl. ........................................ 330/86; 330/278
[58] Field of Search ................... 330/85, 86, 278, 281

[56] References Cited

U.S. PATENT DOCUMENTS 3,482,084 12/1969 Trusov et al. .................. 364/703

FOREIGN PATENT DOCUMENTS 53-29426 8/1978 Japan .
0062413 5/1981 Japan .................................. 330/281
1117821 6/1968 United Kingdom .

Primary Examiner—James B. Mullins
Assistant Examiner—G. Wan
Attorney, Agent, or Firm—Lilling & Greenspan

[57] ABSTRACT

An electrical signal converter with step variable gain comprises a variable gain circuit having its control inputs connected to the outputs of a sequencer for varying the gain of the variable gain circuit according to a step function of time. A negative feedback path between the output and the input of the variable gain circuit includes a second variable gain circuit, whose control inputs are connected to the outputs of the sequencer for varying the gain of the second variable gain circuit in inverse proportion to the abovementioned step function of time.

2 Claims, 4 Drawing Figures

ELECTRICAL SIGNAL CONVERTER WITH STEP VARIABLE GAIN

FIELD OF THE INVENTION

The present invention relates to devices for converting electrical signals, and more particularly to electrical signal converters with step variable gain.

DESCRIPTION OF THE PRIOR ART

Conversion of electrical signals in a step variable manner is carried out by varying, in accordance with a predetermined step function of time, the gain of a circuit, the input of which is supplied with the signal to be converted.

Known in the art is an electrical signal converter with step variable gain comprising a variable gain circuit, the output of which is the output of the converter, and a sequencer having its outputs connected to the control inputs of the variable gain circuit for varying the gain of the variable gain circuit according to a step function of time (cf. "Analog Integrated Circuits - Devices, Circuits, Systems and Applications", Contributed Editor J. A. Connelly A Wiley-Interscience Publication, John Wiley and Sons, New York, London, Sydney, Toronto, 1975).

Variation of the gain of such a converter depends completely on variation of the gain of the variable gain circuit so that deviations of the latter gain from the assigned values lead to the same deviations in the gain of the converter. At the same time, the gain of the variable gain circuit is affected by changes in the resistance of the converter load, the influence of the load being the greater, the smaller is the load resistance. Therefore, variations in the load resistance bring about deviations of the converter gain from the assigned law of its variation thus reducing the accuracy of the conversion of the input signal. If the load resistance is largely determined by reactive elements, which, for example, is the case when a coaxial cable having a considerable capacitance is connected to the output of the converter, the influence of the load resistance on the converter gain causes an increase in the transient response time when the gain is abruptly changed in accordance with the predetermined step function. This also leads to a poorer conversion accuracy.

It is possible to diminish the influence of the load resistance by reducing the output resistance of the variable gain circuit, i.e., by using a more powerful amplifier in said circuit. Such an amplifier, however, has a lower response speed, which means a greater transient response time and, hence, greater distortions in the output signal waveform.

SUMMARY OF THE INVENTION

The principal object of the present invention is to provide an electrical signal converter with step variable gain which is designed so as to diminish the influence of the magnitude and of the reactive properties of the converter load on the converter gain and thus to ensure a more accurate conversion of the input signal.

With this principal object in view, there is proposed an electrical signal converter with a step variable gain comprising a variable gain circuit, the output of which is the output of the converter, and a sequencer having its outputs connected to the control inputs of the variable gain circuit for varying the gain of the variable gain circuit according to a step function of time. According to the invention, the converter further comprises a second variable gain circuit and a comparison circuit connected so that they form a negative feedback path between the output and the input of the variable gain circuit whose output is the output of the converter, the input of the second variable gain circuit being connected to the output of the variable gain circuit whose output is the output of the converter. The control inputs of the second variable gain circuit are connected to the outputs of the sequencer for varying the gain of the second variable gain circuit in inverse proportion to the step function according to which the gain of the variable gain circuit, whose output is the output of the converter, is varied. One input of the comparison circuit is the input of the converter, another input of the comparison circuit is connected to the output of the second variable gain circuit; and the output of the comparison circuit is connected to the input of the variable gain circuit whose output is the output of the converter.

In such a converter negative feedback opposes deviations of the magnitudes assumed by the converter output signal from those corresponding to the required law of variation of the converter gain whereby a more accurate conversion of the input signal is achieved.

Preferably, the comparison circuit comprises a summing amplifier, the inputs of which respectively constitute the inputs of the comparison circuit, and an adder having one input connected to the input of the summing amplifier constituting the input of the comparison circuit which is the input of the converter, the other input of the adder being connected to the output of the summing amplifier, and the output of the adder being the output of the converter.

With such a comparison circuit it is possible to substantially reduce or eliminate completely the static error during variation of the converter gain. This makes possible an accurate adjustment of the converter even though the gain of the forward path for the input signal can only roughly be estimated so that its actual value may differ several times from the assumed value. In addition, such a comparison circuit makes it possible, by using a high-gain summing amplifier, to provide a large gain of the comparison circuit, and hence a high conversion accuracy, as well as a high speed of transmission of variations of the input signal to the converter output.

BRIEF DESCRIPTION OF THE DRAWINGS

The invention is further explained by a detailed description of its preferred embodiments with reference to the accompanying drawings, in which.

DETAILED DESCRIPTION OF THE INVENTION

Figure 1:
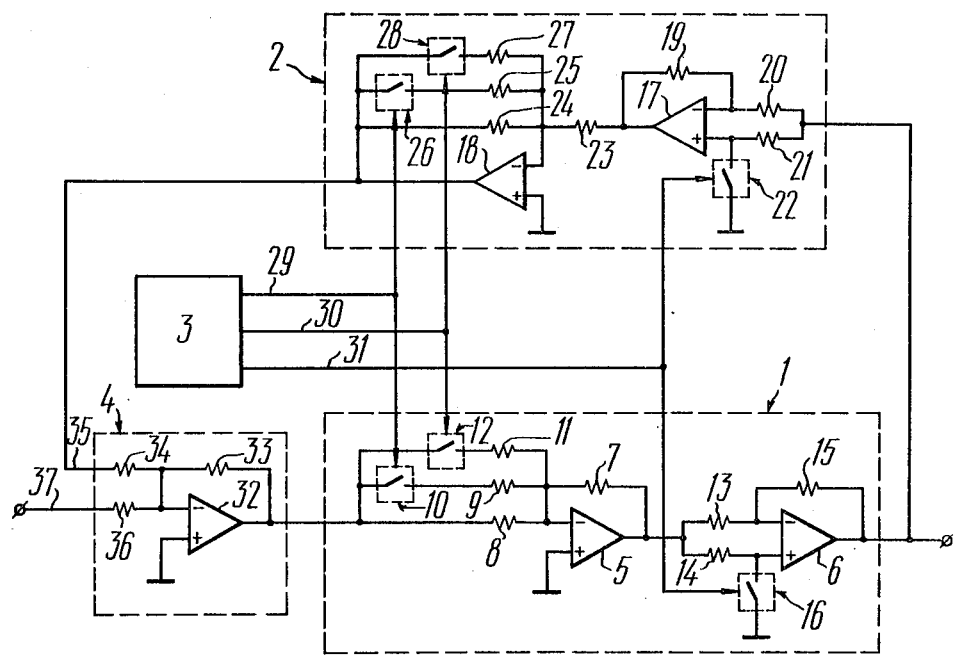
FIG. 1 is a schematic diagram of an electrical signal converter, according to the invention.

Referring to FIG. 1, the electrical signal converter comprises variable gain circuits 1 and 2, a sequencer 3, and a comparison circuit 4.

The variable gain circuit 1 comprises differential amplifiers 5 and 6. The output of the amplifier 5 is connected to its inverting input via a resistor 7 forming a negative feedback path. The inverting input of the amplifier 5 is connected to the output of the comparison circuit 4 via three parallel-connected circuits one of which is formed by a resistor 8, another is formed by a resistor 9 and a controlled electronic switch 10 connected in series, and the third is formed by a resistor 11 and a controlled electronic switch 12 connected in series. The inverting and non-inverting inputs of the differential amplifier 6 are respectively connected via resistors 13 and 14 to the output of the amplifier 5. The output of the amplifier 6 is connected to its inverting input via a resistor 15 forming a negative feedback path. The non-inverting input of the amplifier 6 is connected to ground via a controlled electronic switch 16. The junction point of the input circuits of the amplifier 5 constitutes the input of the variable gain circuit 1. The output of the differential amplifier 6 constitutes the output of the circuit 1 which is also the output of the converter. The control inputs of the electronic switches 10, 12 and 16 constitute the control inputs of the circuit 1.

The variable gain circuit 2 comprises differential amplifiers 17 and 18. The output of the differential amplifier 17 is connected to its inverting input via a resistor 19 forming a negative feedback path. The inverting and non-inverting inputs of the amplifier 17 are respectively connected via resistors 20 and 21 to the output of the variable gain circuit 1, the junction point of the resistors 20 and 21 being the input of the variable gain circuit 2. The non-inverting input of the amplifier 17 is connected to ground via a controlled electronic switch 22. The output of the amplifier 17 is connected via a resistor 23 to the inverting input of the amplifier 18. The output of the amplifier 18 is connected to its inverting input via three parallel-connected negative feedback circuits one of which is formed by a resistor 24, another is formed by a resistor 25 and a controlled electronic switch 26 connected in series, and the third is formed by a resistor 27 and a controlled electronic switch 28 connected in series. The output of the amplifier 18 is the output of the variable gain circuit 2. The control inputs of the electronic switches 22, 26 and 28 constitute the control inputs of the circuit 2.

The controlled electronic switches 10, 12, 16, 22, 26 and 28 may be field-effect transistors, the gates of which constitute the control inputs of the switches.

The sequencer 3 has three outputs 29, 30 and 31. The output 29 is connected to the control input of the switch 10 of the variable gain circuit 1 and to the control input of the switch 26 of the variable gain circuit 2, the output 30 is connected to the control inputs of the switch 12 of the circuit 1 and of the switch 28 of the circuit 2, and the output 31 is connected to the control inputs of the switch 16 of the circuit 1 and of the switch 22 of the circuit 2. The sequencer 3 may be any known circuit which provides variation of its output signal in accordance with a predetermined sequence. Such circuits usually include flip-flops and logic gates.

The comparison circuit 4 comprises a differential amplifier 32 having its output connected to its inverting input via a resistor 33 forming a negative feedback path. The inverting input of the amplifier 32 is connected to one terminal of the resistor 34, the other terminal of the resistor 34 constituting an input 35 of the comparison circuit 4 and being connected to the output of the differential amplifier 18 of the variable gain circuit 2. The inverting input of the amplifier 32 is further connected to one terminal of a resistor 36, the other terminal of the resistor 36 constituting another input 37 of the comparison circuit 4, which is also the input of the converter. The output of the amplifier 32 is the output of the comparison circuit 4.

The converter shown in FIG. 1 operates as follows.

The gains of the gain variable circuits 1 and 2 are determined by the positions of the switches 10, 12, 16, 22, 26 and 28 according to changes in the control signals at the outputs 29–31 of the sequencer 3. Closure of the switch 10 or 12 leads to an increase in the absolute value of the gain of the variable gain circuit 1, while opening of one of these switches leads to a decrease in the absolute value of the gain of the circuit 1. Closure of the switch 26 or 28 leads to a decrease in the absolute value of the gain of the variable gain circuit 2, while opening of one of these switches leads to an increase in the absolute value of the gain of the circuit 2. The resistances of the resistors 13, 14 and 15 of the circuit 1 and the resistances of the resistors 19, 20 and 21 of the circuit 2 are chosen so that the resistance of the resistor 13 equals the resistance of the resistor 15, the resistance of the resistor 14 is much greater than the resistance of the closed switch 16 and much smaller than the resistance of the open switch 16, the resistance of the resistor 19 equals the resistance of the resistor 20, and the resistance of the resistor 21 is much greater than the resistance of the closed switch 22 and much smaller than the resistance of the open switch 22. Then, the gain for the signal transmitted from the output of the amplifier 5 to the output of the amplifier 6 is equal to positive unity when the switch 16 is open and to negative unity when the switch 16 is closed, while the gain for the signal transmitted from the output of the amplifier 6 to the output of the amplifier 17 is equal to positive unity when the switch 22 is open and to negative unity when the switch 22 is closed. Therefore the gains of the circuits 1 and 2 are positive when the switches 16 and 22, respectively, are open and are negative when the switches 16 and 22, respectively, are closed.

Figure 2A:
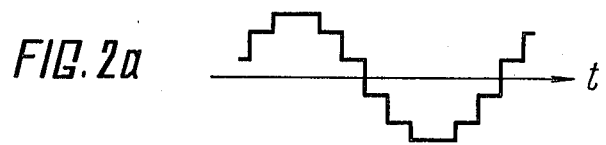
FIG. 2 (a,b) are graphs, showing variations of the gains of the converter circuits with time.

By selecting the time intervals between changes in the signals at the outputs 29–31 of the sequencer 3 and the resistances of the resistors 8, 9 and 11 it is possible to set the required step function according to which the gain of the circuit 1 varies with time. For example, to provide variation of the gain of the circuit 1 according to a step function representing a stepped sine wave the signals at the outputs 29–31 of the sequencer 3 may vary so as to produce the following switching sequence: the switch 10 closes, the switch 12 closes, the switch 12 opens, the switch 10 opens, the switch 16 changes position, the switch 10 closes, the switch 12 closes, the switch 12 opens, the switch 10 opens, the switch 16 changes position, the switch 10 closes, and so on. The variation of the gain of the circuit 1 in such a case is shown in FIG. 2a.

The changes in the control signals at the outputs 29, 30 and 31 of the sequencer 3 (FIG. 1), which produce switching of the switches 10, 12 and 16 of the variable gain circuit 1, lead also to switching of the switches 26, 28 and 22, repsectively, of the variable gain circuit 2. The resistances of the resistors 24, 25 and 27 of the circuit 2 are chosen so that they are respectively proportional to the resistances of the resistors 8, 9 and 11 of the circuit 1. In such a case the magnitudes of the gain of the circuit 2 corresponding to different positions of the switches 26 and 28 will be inversely proportional to the magnitudes of the gain of the circuit 1 corresponding to the same positions of the switches 10 and 12, respectively. During variation of the gains of the circuits 1 and 2, a reversal in polarity of the gain of the circuit 1 will be accompanied by a reversal in polarity of the gain of the circuit 2 because of simultaneous switching of the switches 16 and 22. Therefore, the magnitudes assumed by the gain of the circuit 2 at different time instants will be inversely proportional to the magnitudes assumed by the gain of the circuit 1 at the same time instants, i.e., the gain of the circuit 2 during variation of the control signals at the outputs 29, 30 and 31 of the sequencer 3 varies according to a step function which is inversely proportional to the function according to which varies the gain of the circuit 1.

Figure 2B:
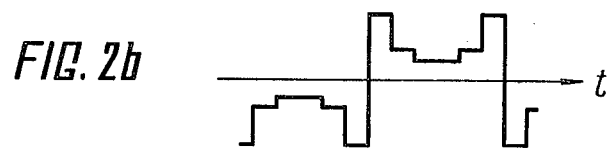

The variation of the gain of the circuit 2 when the gain of the circuit 1 varies according to a stepped sine wave is shown in FIG. 2b.

If the differential amplifiers 5, 16, 17, 18 and 32 are connected as shown in FIG. 1, the variable gain circuit 2 and the comparison circuit 4 form a negative feedback path between the output and the input of the variable gain circuit 1. In that case the gain K of the converter is determined by the expression:

$$K = \frac{\alpha K_1}{i + \beta K_1 K_2}, \quad (1)$$

where
- $\alpha$ is the gain of the comparison circuit 4 for the signal applied to the input 37,
- $K_1$ is the gain of the variable gain circuit 1,
- $\beta$ is the gain of the comparison circuit 4 for the signal applied to the input 35,
- $K_2$ is the gain of the variable gain circuit 2.

Since the gain $K_2$ of the circuit 2 is inversely proportional to the gain $K_1$ of the circuit 1, the product $K_1K_2$ of said gains remains constant during operation of the converter so that the gain K of the converter varies in proportion to the gain $K_1$ of the circuit 1. The signal at the input 35 of the comparison circuit 4 in such a case has the same waveform as the signal at the input 37, i.e. the signal to be converted, a change in the gain of the circuit 1 being compensated for by a change in the gain of the circuit 2 so that the gain for the signal transmitted from the input of the circuit 1 to the output of the circuit 2 remains constant. For example, if the input of the converter is supplied with a constant volatage, the voltage at the input 35 of the comparison circuit 4 will also remain constant.

A deviation of the gain of the circuit 1 from a preset value, e.g. due to a change in the resistance of the converter load (not shown), causes the gain K of the converter to change by a value which is $\beta K_1 K_2$ times less than the value of deviation of the gain $K_1$ of the circuit 1 because deviation in the gain of the circuit 1 leads to a change in the signal at the input 35 of the comparison circuit 4 and hence in its output signal, with the result that deviation in the gain of the circuit 1 is compensated for by a change in the gain of the circuit 2. For example, with the gains $K_1$ and $K_2$ of the circuits 1 and 2 equal to unity and the gain $\beta$ of the comparison circuit 4 for the signal applied to the input 35 equal to 100, a deviation of 1% in the gain of the circuit 1 leads to a change of only 0,01% in the gain of the converter.

Similarly, if the converter load has a considerable capacitance or inductance, their influence on the converter response to switching of the switches 10, 12 and 16 will be $\beta K_1 K_2$ times less than in the known converter circuit which provides no feedback from the output to the input of the circuit 1. This ensures a small transient response time.

The accuracy of variation of the converter gain according to the preset step function is mainly determined by the accuracy of variation of the gain of the circuit 2, as well as by the accuracy with which the resistances of the resistors 33, 34 and 36 are chosen. Deviations in the gain of the circuit 1, as pointed out above, have relatively little influence on the gain of the converter if the value of the product $\beta K_1 K_2$ is sufficiently great.

The signal at the output of the converter is developed with a static error equal to the magnitude of the input signal divided by the value of the product $\beta K_1 K_2$. This will result in an error in the converter output signal unless the static error is taken into account when the parameters of the converter components are chosen. To obtain a large gain of the comparison circuit it is expedient to employ a summing amplifier with no feedback path between its output and input, such an amplifier having a smaller response time in comparison with a feedback amplifier. However, the gain of such an amplifier can usually be estimated only roughly so that its actual value may differ several times from the value used for calculation of the static error, which error in such a case is difficult to estimate and take into account.

Figure 3:
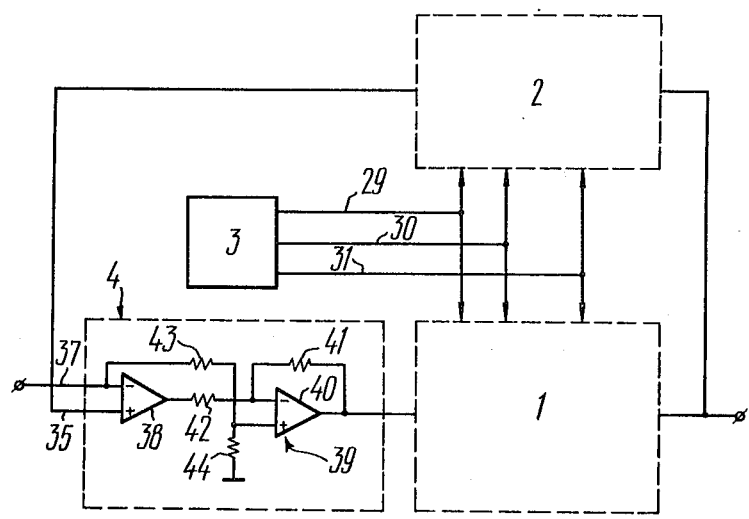
FIG. 3 is a schematic diagram of an electrical signal converter, according to one of the embodiments of the invention.

In the converter shown in FIG. 3, the comparison circuit 4 comprises a summing amplifier 38 and an adder 39.

The summing amplifier 38 is a differential amplifier. The inverting input of the amplifier 38 constitutes the input 37 of the comparison circuit 4 which is the input of the converter. The non-inverting input of the amplifier 38 constitutes the input 35 of the comparison circuit connected to the output of the variable gain circuit 2.

The adder 39 includes a differential amplifier 40. The output of the amplifier 40 is connected to its inverting input via a resistor 41 forming a negative feedback path. The inverting input of the amplifier 40 constitutes one of the inputs of the adder 39 and is connected to the output of the amplifier 38 via a resistor 42. The non-inverting input of the amplifier 40 constitutes the other input of the adder 39 and is connected via a resistor 43 to the inverting input of the amplifier 38 and via a resistor 44 to ground. The output of the amplifier 40 is the output of the adder 39 and of the comparison circuit 4 and is connected to the input of the variable gain circuit 1.

The gain of the converter shown in FIG. 3 is determined by the expression:

$$K = \frac{(\gamma \delta + \epsilon) K_1}{i + \epsilon K_1 K_2}, \quad (2)$$

where
- $\gamma$ is the gain of the amplifier 38,
- $\delta$ is the gain of the adder 39 for the signal applied from the output of the amplifier 38,
- $\epsilon$ is the gain of the adder 39 for the signal applied from the input 37 of the comparison circuit 4.

During variation of the gain of the variable gain circuit 1 of the converter shown in FIG. 3 a change in the gain of the circuit 1 produces a $\gamma \delta K_1 K_2$ times smaller change in the converter gain. At the same time, as will be easily seen from the expression (2), the static error of the converter shown in FIG. 3 equals zero irrespective of the gain of the amplifier 38 if the parameters of the components, of the adder 39 and of the variable gain circuits 1 and 2 are chosen so that the product $\epsilon K_1 K_2$ is unity. Therefore, with the parameters of the adder 39 and of the circuits 1 and 2 so chosen, there is no static error to consider and hence no need for accurate estimation of the gain of the amplifier 38 to determine the parameters of the converter components ensuring variation of the converter gain in close agreement with the required step function. For example, a change in the converter gain no greater than 0.01% will be ensured upon a change of 1% in the gain of the circuit 1 if $K_1 = K_2 = \delta = \epsilon = 1$ and $\gamma \sqrt{100}$.

Application of a signal from the input of the converter directly to one of the inputs of the adder 39 leads also to a more rapid transmission of variations in the input signal to the output of the converter because of smaller influence of the time constant of the amplifier 38 on the transmission of the input signal.

The adder 39 may be combined with the amplifier 5 (FIG. 1) of the variable gain circuit 1. Then the inverting input of the amplifier 5 is connected through corresponding resistors to the output of the amplifier 38 (FIG. 3) and to the input of the converter, the output of the variable gain circuit 2 being connected to the inverting input of the amplifier 38, while the input signal is applied to the non-inverting input of the amplifier 38. The switches 10 and 12 (FIG. 1) in such a case are connected into the feedback circuits of the amplifier 5 and the switches 26 and 28 are connected into the input circuits of the amplifier 18.

If there is no need to reverse the sign of the step function according to which the converter gain is varied, the amplifiers 6 and 17 are not used. In that case the output of the amplifier 5 is the output of the converter and is connected via the resistor 23 to the input of the amplifier 18.

In case of a bipolar step function the differential amplifiers 6 and 17 may be substituted by one feedback differential amplifier having its output connected to the input 37 of the comparison circuit 4 and its non-inverting input connected to ground through an electronic switch controlled by the signal from the output 31 of the sequencer 3 similarly to the switches 16 and 22 of the converter described above. The signal to be converted in that case is applied to the inputs of the amplifier through resistors, the resistances of which are chosen in the same way as the resistances of the resistors 13, 14 and 20, 21 in the described converter.

It will be clear that the variable gain circuits 1 and 2 may be constituted by various circuits capable of changing their gains by predetermined values in response to changes in the signals applied to their control inputs. Such circuits, for example, may comprise variable voltage attenuators.

Commercial Applicability

The proposed converter may be used in precision stepped signal generating circuits, such as stepped sine wave generators, and in other circuits designed for converting electrical signals in close agreement with a predetermined step function, such as precision synchronous detectors.

If the converter is used for generating a stepped signal, its input is supplied with a constant voltage, the output of the converter being in that case a stepped signal varying in close agreement with a predetermined step function of time. If the converter is used as a synchronous detector, the function according to which the gain of the converter is varied is a stepped sinusoid, the direct component of the signal developed at the output of the converter being in that case proportional to the input signal component having the same frequency and phase as the sinusoid according to which the gain of the converter is varied.

It is also expedient to use the present invention in quadrature converters. In such converters the gain for the signal transmitted from the input of the converter to one of its outputs varies according to a stepped sine wave which is 90° out of phase with respect to the stepped sine wave according to which the gain for the signal transmitted from the input of the converter to its other output is varied. The employment of the present invention in such converters makes it possible to provide a highly accurate phase shift of 90° between the variations of the gains.

What is claimed is:

1. An electrical signal converter with step variable gain comprising a first variable gain circuit having an input, control inputs and an output serving as an output of the converter; a second variable gain circuit having an input connected to said output of said first variable gain circuit, control inputs, and an output; a sequencer having outputs connected to said control inputs of said first and second variable gain circuits, said sequencer varying the gain of the first variable gain circuit according to a step function of time and varying the gain of the second variable gain circuit in inverse proportion to the step function according to which the gain of the first variable gain circuit is varied; and a comparison circuit having a first input serving as an input of the converter, a second input connected to said output of said second variable gain circuit, an an output connected to the input of said first variable gain circuit; wherein said second variable gain circuit and said comparison circuit define a negative feedback path between the output and the input of the first variable gain circuit.

2. An electrical signal converter according to claim 1, wherein the comparison circuit comprises a summing amplifier having first and second inputs which respectively constitute the inputs of the comparison circuit, and an adder having a first input connected to the first input of the summing amplifier, a second input connected to an output of the summing amplifier, and an output serving as the output of the comparison circuit.

* * * * *